United States Patent [19]

Betirac

[11] Patent Number: 4,595,999
[45] Date of Patent: Jun. 17, 1986

[54] NON-VOLATILE RANDOM ACCESS MEMORY CELL WITH CMOS TRANSISTORS HAVING A COMMON FLOATING GRID

[75] Inventor: Michel Betirac, Seyssinet, France

[73] Assignee: Societe pour l'Etude et la Fabrication de Circuits Integres Speciaux, Grenoble, France

[21] Appl. No.: 594,978

[22] Filed: Mar. 29, 1984

[30] Foreign Application Priority Data

Mar. 31, 1983 [FR] France ................................. 83 05360

[51] Int. Cl.$^4$ ............................................. G11C 11/40
[52] U.S. Cl. ..................................... 365/154; 365/182; 365/202
[58] Field of Search ............... 365/182, 185, 189, 154, 365/202

[56] References Cited

U.S. PATENT DOCUMENTS 4,193,128  3/1980  Brewer ................................. 365/228
4,300,212  11/1981  Simko ................................... 365/185

FOREIGN PATENT DOCUMENTS 2622307  12/1976  Fed. Rep. of Germany .

OTHER PUBLICATIONS

IBM Technical Disclosure Bulletin, vol. 24, No. 5 (Oct. 1981), H. H. Chao, "Static Ram with Nonvolatile Backup Memory," pp. 2456–2457.

Primary Examiner—Terrell W. Fears
Attorney, Agent, or Firm—Oblon, Fisher, Spivak, McClelland & Maier

[57] ABSTRACT

The invention relates to a non-volatile static memory cell.

The cell comprises a bistable flip-flop with four transistors, with two complementary outputs. Between the outputs is placed a non-volatile storage element comprising two complementary transistors in series, namely a p channel transistor and a n channel transistor, said transistors having a common floating grid and a common control grid. A charge injection zone is provided on the side of the source region on the n channel transistor. The region is connected to an output of the flip-flop, while the control grid is connected to the other output.

Repositioning takes place without any reversal of the original state of the flip-flop.

4 Claims, 5 Drawing Figures

NON-VOLATILE RANDOM ACCESS MEMORY CELL WITH CMOS TRANSISTORS HAVING A COMMON FLOATING GRID

BACKGROUND OF THE INVENTION

The present invention relates to static integrated random access memories (static RAM's).

These memories are called random access memories, because they only retain information in the case of a continuous power supply thereto, an accidental power failure erases the information.

Increasing efforts are being made to find means of protecting the information before it is lost by a power failure in a permanent memory element associated with each RAM cell. Such memories are called non-volatile random access memories and differ from pure random access memories in that they protect the information stored, even in the case of a power failure, whilst they differ from permanent memories, because, outside the times of non-volatile recording of information, they operate in the manner of random access memories, i.e. with a high speed and maximum ease of reading and writing.

Non-volatile random access memories have already been proposed, particularly those using floating grid complementary MOS transistors as the storage element.

For example, reference can be made to the Troutman U.S. Pat. No. 4,128,773, which discloses a RAM cell, which is a conventional bistable flip-flop with four transistors, supplied with power between two supply terminals Vss and Vdd. The storage element is essentially a series assembly of two complementary transistors, one having an n channel and the other a p channel, said series assemblies being placed between the Vss and Vdd terminals and having a common floating grid and a common control grid connected to an output of the flip-flop, whilst the junction point of the two complementary transistors is connected to the other complementary output of the flip-flop. A zone for injecting electric charges into the floating grid is provided on the side of the junction point of the two complementary transistors.

Although this assembly constitutes a non-volatile RAM cell, it suffers from two other types of disadvantage. The first disadvantage is that when the non-volatile information has been recorded, e.g. during a power failure, and it is then wished to return the flip-flop into a state corresponding to the thus protected information, it is found that the flip-flop is repositioned in the state opposite to the initial state. Although the information is protected, it must be complemented in order to return to its true value. The second disadvantage is the asymmetrization of the flip-flop. As a function of the state of the permanent storage element, there is the equivalent of a transistor in parallel on one of the branches of the flip-flop and this falsifies the balance of the latter. The storage branch disturbs the normal RAM operation of the flip-flop.

SUMMARY OF THE INVENTION

The present invention proposes a different type of non-volatile storage cell, which does not suffer from these disadvantages.

This cell also comprises a bistable flip-flop with two complementary outputs supplied by a d.c. voltage. A non-volatile storage element is connected between two complementary outputs of the flip-flop and said element has a set of two complementary MOS transistors, namely a n channel transistor and a p channel transistor, said two transistors having a common floating grid covering their channel regions and insulated therefrom by a first thin insulating layer, and a common control grid at least partly covering the floating grid and insulated therefrom by a second thin insulating layer. The first insulating layer has a very thin area on the side of the source region of one of the complementary transistors, said source region being connected to a first output of the flip-flop and the control grid is connected to the second output. The cell also comprises means for temporarily applying a supply potential between each of the two complementary transistors and the output to which it is directly or indirectly connected.

The complementary transistors can be connected in series and their junction point is then connected by a capacitor or a transistor to the supply voltage. If it is a transistor, its grid receives a repositioning control signal for restoring the flip-flop to its initial state following an interruption to the power supply.

In order to improve the non-volatile recording conditions during a protection operation, it is possible to provide complementary MOS transistors in series with the two complementary transistors, between the two outputs of the flip-flop, and more particularly a transistor connected between the first output of the flip-flop and the complementary transistors, said transistor being controlled by a repositioning signal, or a group of two transistors in series connected between the same points with one of their grids connected to the second output of the flip-flop and the other grid being connected to the junction point of the two complementary transistors.

BRIEF DESCRIPTION OF THE DRAWINGS

The invention is described in greater detail hereinafter relative to non-limitative embodiments and with reference to the attached drawings, wherein show.

DETAILED DESCRIPTION OF THE INVENTION

Figure 1:
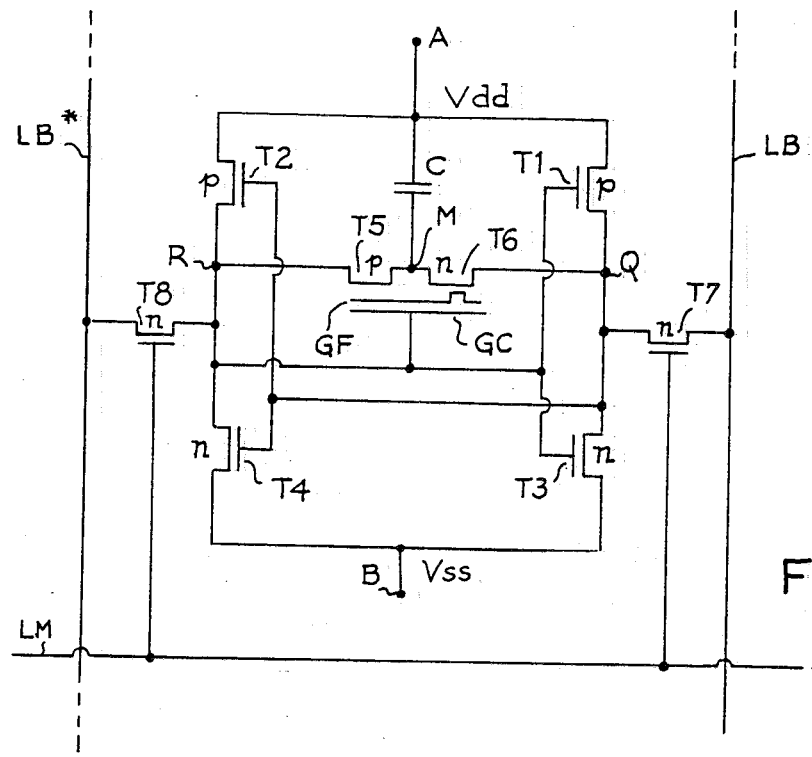
FIG. 1 the basic diagram of the non-volatile random access memory cell according to the invention.

The storage cell of FIG. 1 comprises a conventional bistable flip-flop, supplied between two supply terminals with d.c. voltage A (voltage Vdd) and B (voltage Vss.). This flip-flop comprises four MOS transistors T1, T2, T3 and T4. Transistors T1 and T3 are in series between terminals A and B, as are transistors T2 and T4. The grid of transistor T4 is connected to the junction point Q of transistors T1 and T3, whilst the grid of transistor T3 is connected to the junction point R of transistors T2 and T4. Points Q and R are the two complementary outputs of the flip-flop, the first being connected by a transistor T7 to a bit LB and the second by a transistor T8 to a complementary bit line LB*. Both of the transistors T7 and T8 are controlled by a word line LM.

Transistors T3 and T4 are n channel transistors having substantially equivalent electrical characteristics, whilst transistors T1 and T2 are p channel transistors and also has substantially equivalent characteristics.

The grid of transistor T1 is connected to that of transistor T3, whilst the grid of transistor T2 is connected to that of transistor T4.

The storage element is constituted by a series arrangement of the p channel MOS transistor T5 and the n channel MOS transistor T6. These transistors have a common floating grid GF and a common control grid GC. The latter is connected to the output R of the flip-flop. The series arrangement of the two complementary transistors T5 and T6 is connected between terminals Q and R. A zone for injecting electrons into the floating grid GF is provided on the side of output Q in the n channel transistor T6 connected to said output.

A capacitor C is connected between the junction point M of the complementary transistors and the supply terminal A.

In order to prevent ambiguities in the description, the side connected to outputs Q and R will be called the source of transistors T5 and T6, whilst the side of the junction point will be called the drain. Thus, the injection zone is provided on the source side of the n channel transistor T6.

Figure 2:
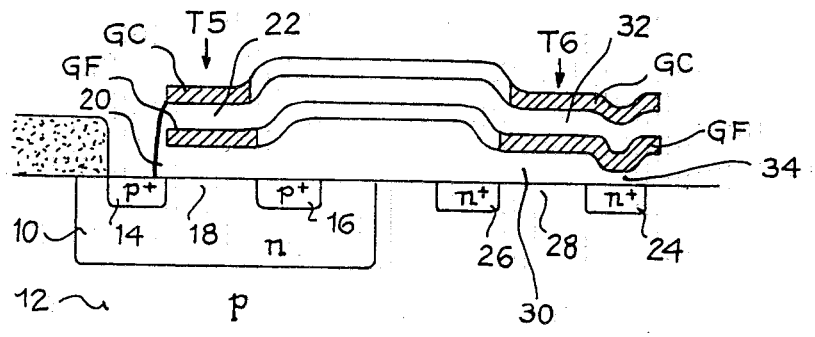
FIG. 2 a cross-section of the diagrammatic structure of the storage element.

FIG. 2 shows the structure of the series arrangement of the two complementary transistors T5 and T6. FIG. 2 is diagrammatic and does not aim at completely describing the topology and constructional details, the latter being effected in accordance with the production procedures used for floating grid transistors.

For example, the p channel transistor T5 is formed within a diffused type n box 10 inside a type p semiconductor substrate 12. This transistor has a type p+ source region 14, a type p+ drain region 16 and between the two, a type n channel region 18. The channel region is covered with a first thin insulating layer 20, which is itself covered by a conductive floating grid GF. Floating grid GF is covered with a second thin insulating layer 22, which is itself covered by a control grid GC.

The n channel transistor T6 is formed directly in the substrate and has a type n+ source region 24, a type n+ drain region 26 and, connected by a not shown connection to the drain region of transistor T5, and, between the source region and the drain region, a channel region 28 covered by a thin insulating layer 30, itself surmounted by a conductive floating grid, which is the same grid GF which covers the transistor T5. Grid GF is surrounded by another insulating layer 32 and a control grid GC, which is the same grid GC as covers transistor T5.

There is a thinning down zone 34 of insulating layer 30 above the source region 24 or channel region 28 of the n channel transistor T6. This zone constitutes a thin zone to facilitate the injection of electric charges through insulating layer 30 into floating grid GF. Layer 30 can have a thickness of a few hundred Ångströms, but this may only be a few dozen Ångströms in the thinned down zone 34.

The metallic or silicon connections to the source and drain regions and the control grid are not shown in FIG. 2.

Returning to FIG. 1, an explanation will now be given of the operation of the thus described memory cell. The normal d.c. power supply is of approximately 5 V between terminals B and A and the flip-flop either assumes a state such that output Q is at Vdd (5 V) and output R at Vss (0 V), or the reverse state (Q at 0 V and R at 5 V). In the writing mode, this state is imposed by the voltage of zero or 5 V present on bit line LB and the complementary voltage of 5 or 0 V present on the complementary bit line LB*, whilst rendering conductive the transistors T7 and T8 controlled by word line LM.

When a given state has been stored, it can also be read by rendering conductive transistors T7 and T8 as from the word line LM, the bit lines LB and LB* then transmitting the levels of outputs Q and R, i.e. the state of the flip-flop.

In order to protect the state of the flip-flop, voltage Vdd is temporarily passed (e.g. for 10 to 20 ms) to a high value VH of approximately 20 V. This passage of Vdd to 20 V can be carried out either automatically during the detection of a power failure, or systematically at each change of state of the flip-flop (e.g. for a counter), or under the action of a voluntarily given protection instruction.

If output Q is at low level and output R at high level, there are 20 V on control grid GC and 0 V on the source of transistor T6. The latter is made conductive, whilst p channel transistor T5 is blocked. Electrons are injected into the floating grid across the thinned down insulating zone 34. The grid is negatively charged and modifies the apparent threshold voltage (seen from the control grid) of transistors T5 and T6. The threshold voltage of the former is reduced by a few volts, whilst that of the latter is increased by a few volts. For the same voltage applied to the control grid, transistor T5 will have a lower internal resistance than transistor T6.

Under these conditions, when it is wished to reposition the flip-flop for the purpose of again making available the protected information, e.g. during the restoring of the power supply, it is ensured that Vdd passes from 0 to 5 V, transistors T7 and T8 being blocked in order to insulate the flip-flop from the bit lines. This voltage variation is transmitted by capacitor C to point M. Between point M and supply terminal B, there is the equivalent of two divider bridges, one formed by transistors T5 and T4 and the other by transistors T6 and T3. Transistors T3 and T4 are identical and initially have a priori equivalent resistances. However, transistor T5 is more conductive than transistor T6. The potential of point R consequently initially rises faster than that of point Q. This initial asymmetry is sufficient to switch flip-flop into a state corresponding at output Q to Vss (0 V) and output R to Vdd. It should be noted that the repositioning does in fact correspond to the state prior to protection and not to the reversed state.

On starting with an initial state with output R at 0 V and output Q at 5 V, the passage from Vdd to VH=20 V leads to a 20 V potential difference between the control grid GC and the source of the n channel transistor T6 in a direction tending to expel the electrons from the floating grid across the thinned down insulating layer. This expulsion positively charges the floating grid, in such a way that the apparent threshold voltage of the p channel transistor T5 increases and that of the n channel transistor T6 decreases. For the same voltage applied to the control grid GC, transistor T6 will have a lower internal resistance than transistor T5.

On repositioning the flip-flop by passing Vdd from 0 to 5 V, the voltage variation of Vdd is transmitted by capacitor C to point M. In the divider bridges formed between point M and terminal B by transistors T5 and T4 on the one hand and T6 and T3 on the other, it can be seen that initially T3 and T4 have substantially identical resistances, whilst T6 has a much lower resistance than T5. This initial unbalance raises output Q to a higher potential than output R and is sufficient to switch the bistable flip-flop into a state in which output Q is at Vdd and output R at Vss, which corresponds to the initial state which it was wished to protect.

In practice, capacitor C must have a relatively low value (but adequate to transmit the voltage variations of Vdd to point M), in order not to disturb the writing speed in normal operation of the cell (static RAM). Thus, one of the two transistors T5 and T6 is normally made permanently conductive by the charges present on the floating grid and, on forcing outputs R and Q to the given values, capacitor C must be charged as a consequence of this during writing.

Figure 3:
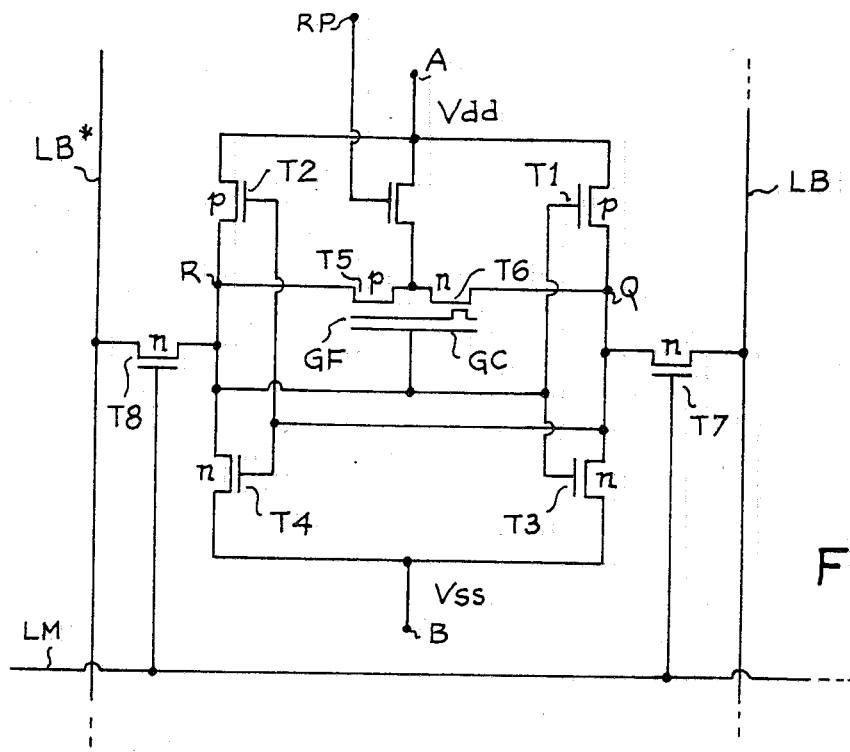
FIG. 3 a constructional variant of the non-volatile cell.

In order to obviate this disadvantage, it is possible to provide the constructional variant shown in FIG. 3, in which capacitor C has been replaced by a n channel transistor T9 in series between point M and terminal A, said transistor being made conductive by a repositioning control signal RP. Outside the repositioning phase, transistor T9 is blocked, whilst during the repositioning phase Vdd is passed from 0 to 5 V by keeping T9 conductive by signal RP.

Figure 4:
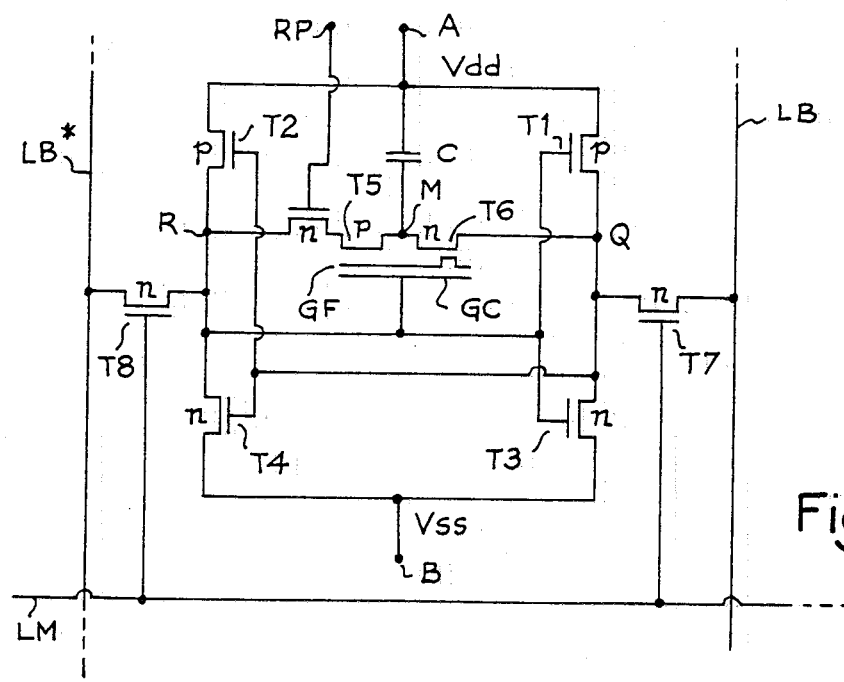
FIGS. 4 and 5 two other variants.

FIG. 4 shows another variant in which a transistor T10 has been inserted in the non-volatile storage branch in series with transistors T5 and T6 between outputs Q and R. The n channel transistor T10 is connected to terminal R and its grid receives a repositioning signal RP, which makes it conductive solely during the repositioning phases. During these phases, transistor T10 is sufficiently conductive (its size being chosen as a consequence of this) to not falsify the conduction asymmetry of transistors T5 and T6. However, during the non-volatile protection phase, it makes it possible to ensure, in the case where transistor T5 is conductive (output R at 0 V) that the potential difference between points R and Q is sufficiently high to not prematurely stop the evacuation of electrons from the floating grid.

The construction of FIG. 4 can also be combined with that of FIG. 3, i.e. capacitor C can be replaced by transistor T9 controlled in the same way as transistor T10 for signal RP.

For the same reason as in the case of FIG. 4, it is also possible to replace transistor T10, controlled by a repositioning signal, by a pair of transistors in series, one having its source and grid connected to output R and the other its grid connected to point M. In this case, it is also possible to provide a supplementary transistor in series between transistor T6 and output Q and having its grid connected to output Q, in order to balance the half-branches between M and R and between M and Q during the positioning.

Figure 5:
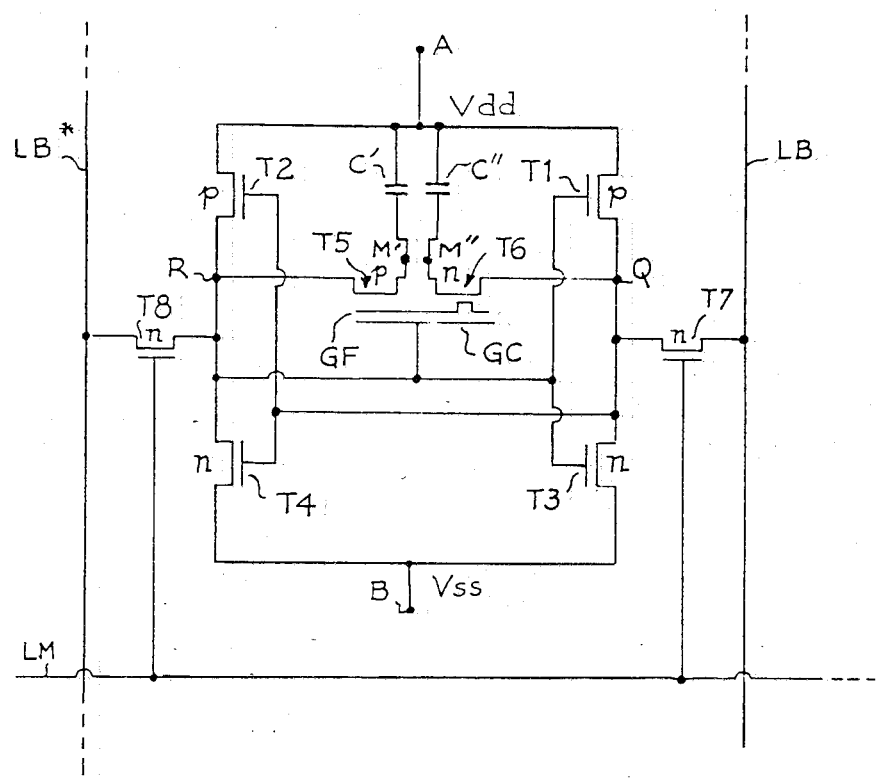

Finally, FIG. 5 shows a further constructional variant in which transistors T5 and T6 are not directly interconnected and instead each is connected by its drain to a respective capacitor C' and C" or a respective transistor, also connected to terminal A. These capacitors or transistors fulfil the same function as capacitor C or transistor T9 and in fact correspond to a doubling of capacitor C or transistor T9. Capacitor C' and C" are identical. If transistors replace capacitors C' and C", said transistors are controlled by the repositioning signal RP. In the case of FIG. 5, there is consequently no direct connection between drains 16 and 26 (FIG. 2) of the complementary transistors. This variant according to FIG. 5 prevents any passage of current in the complementary transistors during the protection phase. It also makes it unnecessary to provide a transistor such as T10 and its control line.

What is claimed is:

1. A non-volatile memory cell, incorporating a bistable flip-flop with two complementary outputs supplied by a d.c. voltage, having a non-volatile storage element, wherein said element is connected between the two complementary outputs of the flip-flop and has a series arrangement of two complementary MOS transistors, namely a n channel transistor and a p channel transistor, said two transistors having a common floating grid covering their channel regions and insulated therefrom by a first thin insulating layer, and a common control grid covering the floating grid and insulated therefrom by a second thin insulating layer, the first insulating layer having a thin injection zone on the side of the source region of one of the complementary transistors said source region being connected to a first output of the flip-flop, whilst the control grid is connected to the second output, said cell also having means for temporarily applying a supply potential to the junction point of the two complementary transistors.

2. A cell according to claim 1, wherein a capacitor is connected between the junction point of the two complementary transistors in series and a supply terminal of the cell.

3. A cell according to claim 1, wherein a transistor is connected between the junction point of the two complementary transistors in series and a supply terminal of the cell, the control grid of the transistor receiving a repositioning signal.

4. A cell according to claim 1, wherein the thin zone is provided above the n channel transistor source.

* * * * *